(12) United States Patent
Pinol Pedret et al.

(10) Patent No.: US 11,101,597 B1
(45) Date of Patent: Aug. 24, 2021

(54) VENTED ELECTRICAL CONNECTOR

(71) Applicant: LEAR CORPORATION, Southfield, MI (US)

(72) Inventors: Montserrat Pinol Pedret, Valls (ES); Antoni Pujol Simon, Valls (ES); Ferran Juanes Ribas, Valls (ES); Jose Antonio Cubero Pitel, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/868,332

(22) Filed: May 6, 2020

(51) Int. Cl.
 *H01R 13/74* (2006.01)
 *H01R 13/52* (2006.01)

(52) U.S. Cl.
 CPC ......... *H01R 13/5216* (2013.01); *H01R 13/74* (2013.01); *H01R 13/5227* (2013.01)

(58) Field of Classification Search
 CPC . H01R 13/5216; H01R 13/74; H01R 13/5227
 See application file for complete search history.

(56) References Cited

U.S. PATENT DOCUMENTS

| 5,447,445 | A | * | 9/1995 | Torii | H01R 13/5219 |
| | | | | | 439/206 |
| 5,522,769 | A | | 6/1996 | DeGuiseppi | |
| 5,762,481 | A | * | 6/1998 | Oi | F02M 37/10 |
| | | | | | 417/423.14 |
| 7,029,317 | B2 | * | 4/2006 | Chen | H01R 13/53 |
| | | | | | 361/679.02 |
| 7,122,270 | B2 | | 10/2006 | Ray, Jr. et al. | |
| 8,956,444 | B2 | | 2/2015 | Holliday | |
| 8,968,063 | B2 | | 3/2015 | Gifford et al. | |
| 9,497,527 | B2 | | 11/2016 | Mittleman et al. | |
| 10,217,980 | B2 | | 2/2019 | Byun et al. | |
| 2008/0070433 | A1 | * | 3/2008 | Zeigler | G01L 19/143 |
| | | | | | 439/206 |
| 2008/0113523 | A1 | * | 5/2008 | Owen | F21V 19/00 |
| | | | | | 439/36 |
| 2016/0167948 | A1 | | 6/2016 | Holliday et al. | |
| 2019/0386425 | A1 | * | 12/2019 | Kondo | H01R 43/26 |
| 2020/0083634 | A1 | * | 3/2020 | Ito | H01R 4/4827 |

FOREIGN PATENT DOCUMENTS

| CH | 000642213 A | * | 3/1984 | ......... H01R 13/5227 |
| CN | 2814959 Y | | 9/2006 | |
| CN | 106690479 A | | 5/2017 | |
| KR | 20030017793 A | | 3/2003 | |

OTHER PUBLICATIONS

W.L. Gore & Associates, Inc., Products, Venting, retrieved from https://www.gore.com/products/categories/venting on Mar. 17, 2020.

* cited by examiner

*Primary Examiner* — Tho D Ta
(74) *Attorney, Agent, or Firm* — Brooks Kushman P.C.

(57) ABSTRACT

An electrical connector includes a connector housing configured for attachment to an electrical enclosure. A first side of the connector housing faces an inside of the electrical enclosure and a second side of the connector housing faces an outside of the electrical enclosure. The connector housing may include a connector aperture configured to receive an electrical conductor, which may extend between the first and second sides of the connector housing. The connector housing may further include a ventilation pathway separate from the connector aperture that defines a fluid communication path between the first side and the second side of the connector housing.

18 Claims, 4 Drawing Sheets

VENTED ELECTRICAL CONNECTOR

TECHNICAL FIELD

The present disclosure relates to a vented electrical connector.

BACKGROUND

Many electrical enclosures are required to be watertight and any connectors attached to the housing must also be sealed. Even so, it is often necessary to provide a pressure-compensation valve to allow the pressure inside the enclosure and outside the enclosure to equalize. To accomplish this, a valve may be positioned in a wall of the enclosure to allow air to move in and out of the enclosure and the pressure to equalize. Although the valve may be configured to allow air to pass through it, it must be constructed so that water or other liquids cannot enter the enclosure. In addition, the valve may also be required to have electromagnetic compatibility (EMC) because the electrical enclosure may be used in an environment where electromagnetic fields—both internal and external to the enclosure—must be shielded. Using a pressure-compensation valve in an electrical enclosure adds both material and assembly costs to the overall product. It would therefore be desirable to have a pressure-compensation system that did not require additional components or assembly.

SUMMARY

Embodiments described herein may include an electrical connector having a connector housing configured for attachment to an electrical enclosure. The connector housing may include a plurality of connector apertures, each configured to receive an electrical conductor therein and having a first end open to an inside of the electrical enclosure and a second end open to an outside of the electrical enclosure when the connector housing is attached to the electrical enclosure. The connector housing may further include a ventilation pathway separate from the connector apertures and forming a fluid communication path between the inside of the electrical enclosure and the outside of the electrical enclosure when the connector housing is attached to the electrical enclosure.

Embodiments described herein may include an electrical connector having a connector housing configured for attachment to an electrical enclosure such that a first side of the connector housing faces an inside of the electrical enclosure and a second side of the connector housing faces an outside of the electrical enclosure. The connector housing may include a connector aperture configured to receive an electrical conductor therein and extending between the first and second sides of the connector housing. The connector housing may further include a ventilation pathway separate from the connector aperture and defining a fluid communication path between the first side and the second side of the connector housing.

Embodiments described herein may include an electrical connector having a housing body configured to receive at least one electrical conductor therein and configured for attachment to an electrical enclosure. The connector housing including a ventilation pathway defining a fluid communication path between the inside of the electrical enclosure and the outside of the electrical enclosure when the housing body is attached to the electrical enclosure.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
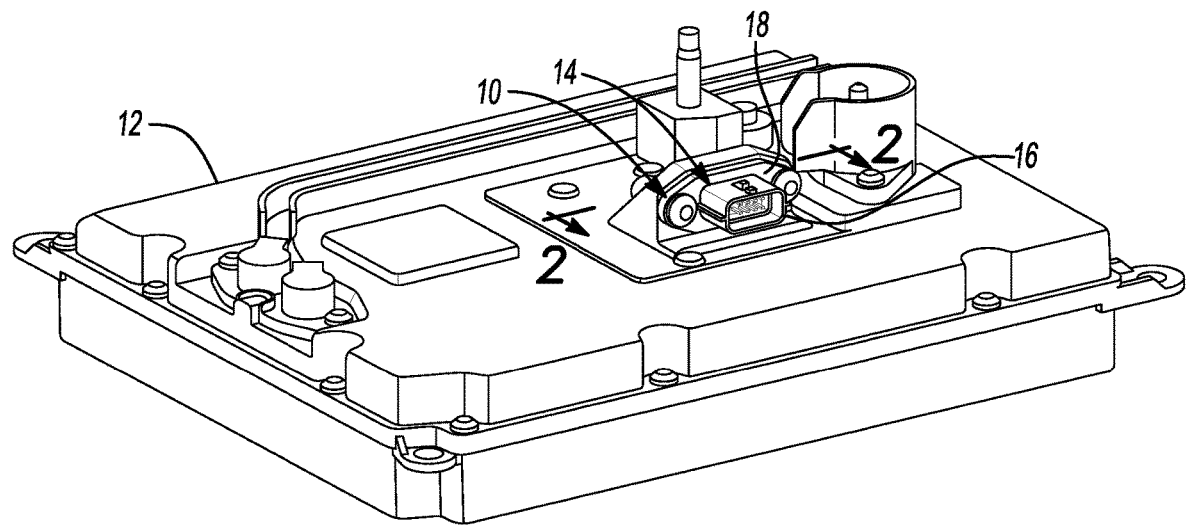
FIG. 1 shows an electrical enclosure including an electrical connector in accordance with embodiments described herein.

FIG. 1 shows an electrical connector 10 in accordance with embodiments described herein. In FIG. 1, the electrical connector 10 is attached to an electrical enclosure 12, which may enclose, for example, a DC/DC converter, an onboard battery charger (OBC), or other type of electrical hardware. As shown in FIG. 1, the electrical connector 10 includes a connector housing 14 having a first portion 16 configured as a housing body and a second portion 18 configured as an attachment arrangement. As explained in more detail below, the connector housing 14 is ventilated to provide pressure equalization between the inside and outside of the electrical enclosure 12, while still inhibiting the ingress of water or other liquid.

Figure 2:
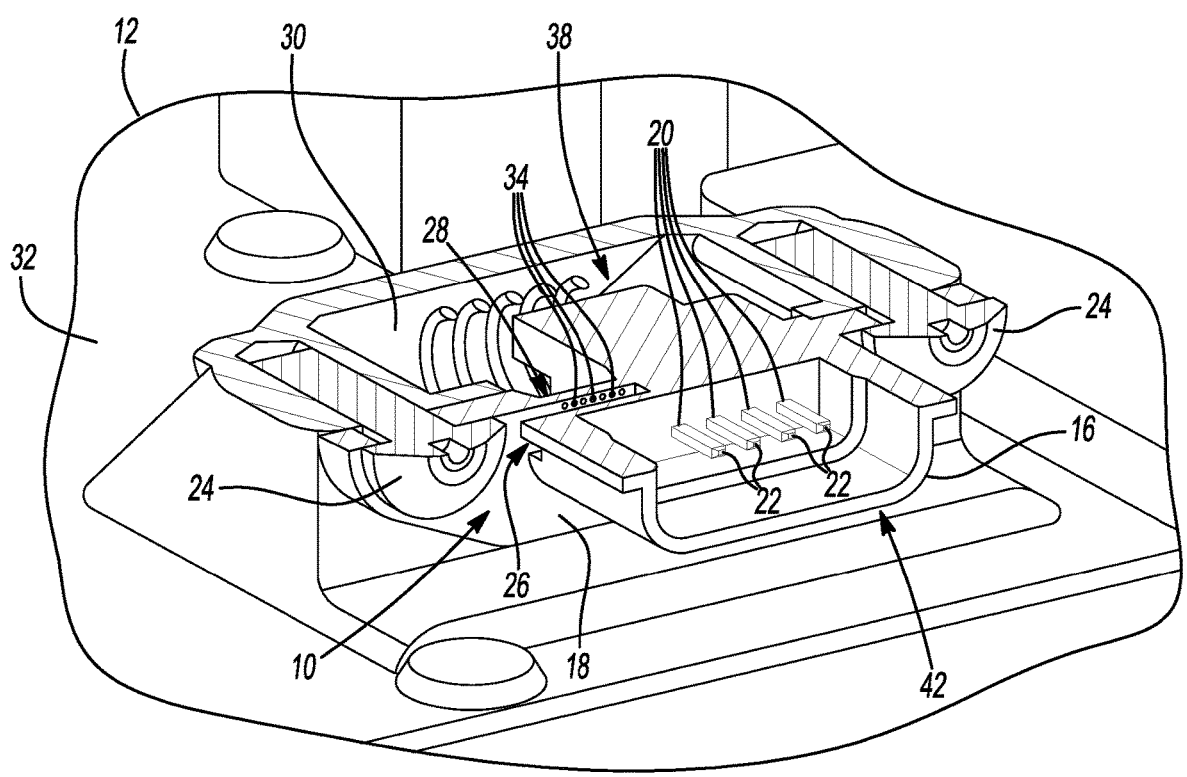
FIG. 2 it shows a partial cross-sectional view of the electrical enclosure and electrical connector shown in FIG. 1.

FIG. 2 shows a cross-sectional view of a portion of the enclosure 12 including the connector 10 taken through the line 2-2 shown in FIG. 1. As shown in FIG. 2, the housing body 16 is configured as a plug connector and includes a plurality of connector apertures 20 each configured to receive an electrical conductor 22, which in this embodiment are pins configured for insertion into a female plug. In the embodiment shown in FIG. 2, the attachment arrangement 18 is configured as a flange configured to be attached to the electrical enclosure 12 with fasteners 24. In other embodiments, a connector housing—such as the connector housing 14—may be integrated with an electrical enclosure. For example, the connector housing may include a connector portion molded with an electrical enclosure portion to form a unitary structure—this is explained in more detail below in conjunction with FIG. 5. Also shown in FIG. 2 is a portion of a ventilation arrangement 26, which in this embodiment includes a plurality of ventilation pathways, shown generally as ventilation pathway 28. The ventilation pathway 28 is separate from the connector apertures 20 and forms a fluid communication path between an inside 30 of the enclosure 12 and an outside 32 of the enclosure 12. In this embodiment, the ventilation arrangement 26 includes a plurality of the ventilation pathways 28, each configured as an aperture 34, not all of which are labeled in FIG. 2 for clarity.

Figure 3:
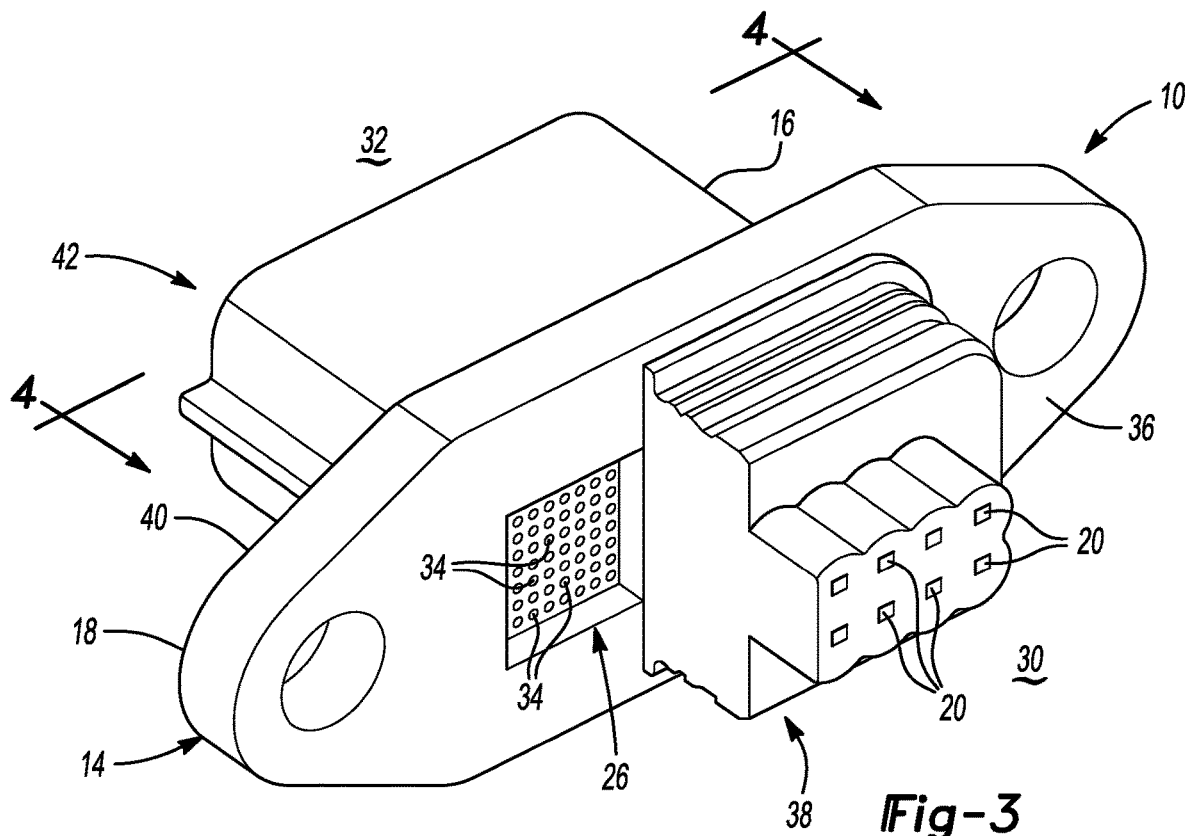
FIG. 3 shows an electrical connector in accordance with embodiments described herein including a plurality of ventilation apertures.
Figure 4A:
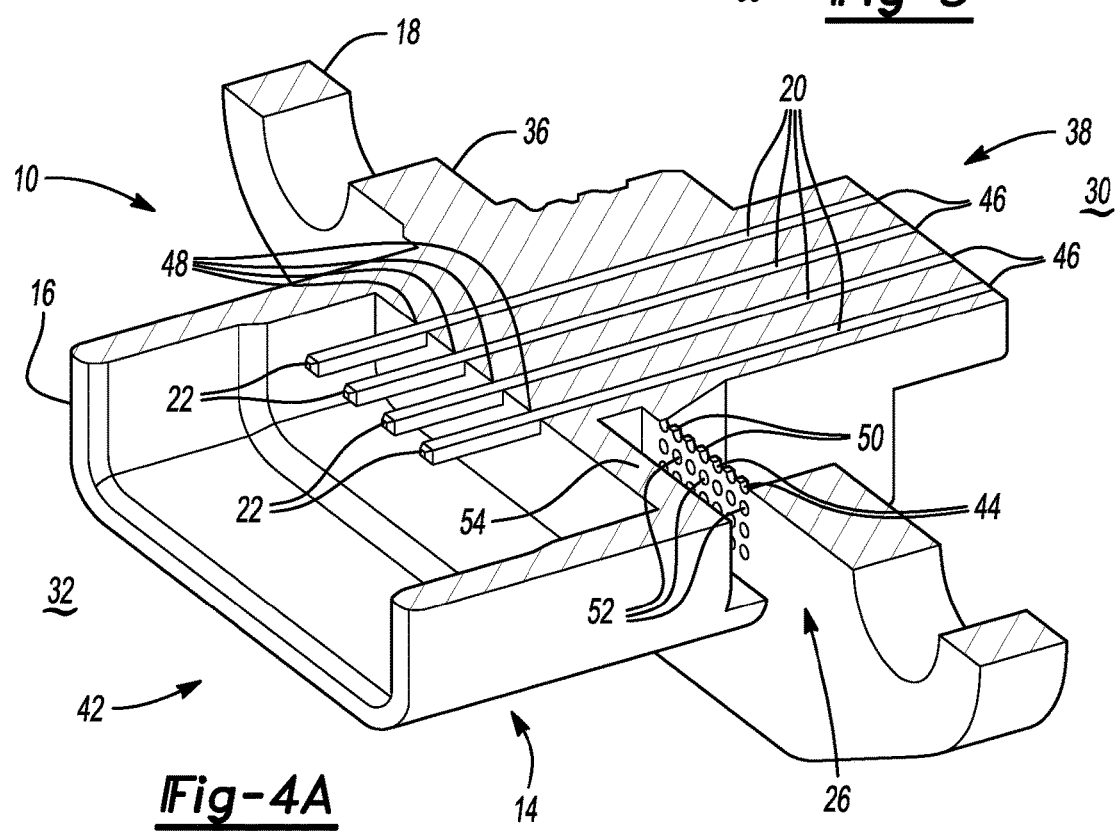
FIG. 4A shows a cross-sectional view of the electrical connector shown in FIG. 3.

FIGS. 3 and 4 show the electrical connector 10 isolated from the enclosure 12, although the inside 30 and the outside 32 of the electrical enclosure 12 are illustrated schematically for reference. As shown in these figures, the second portion 18 of the connector housing 14 includes a first face 36, which is on a first side 38 of the connector housing 14. The second portion 18 also includes a second face 40, which is on a second side 42 of the connector housing 14. The first side 38 of the connector housing 14 faces an inside of the electrical enclosure 12, while the second side 42 of the connector housing 14 faces an outside of the enclosure 12—see also FIG. 2. As shown in FIG. 4A, the ventilation pathways—in this embodiment the apertures 34—extend between the first face 36 in the second face 40 of the second portion 18 of the connector housing 14. In the area of the apertures 34, the connector housing 14 has a reduced wall thickness such that the first face 36 extends into the wall of the housing. The thinner wall thickness in the area of the apertures 34 may be desirable to facilitate manufacturing—especially when the apertures 34 are created with a laser. Too much material in the area of the apertures 34 may make the creation of the apertures 34 difficult or impossible. The ventilation pathways 34 form a plurality of fluid communication paths 44—not all of which are labeled in FIG. 4A for clarity—between the inside of the electrical enclosure 30 and the outside of the electrical enclosure 32—see also FIG. 2.

As illustrated in FIG. 4A, the fluid communication paths 44 extend between the first and second sides 38, 42 of the connector housing 14. Also shown in FIG. 4A are the connector apertures 20, each of which has a first end 46 open to the inside 30 of the electrical enclosure 12 and a second end 48 open to the outside 32 of the electrical enclosure 12. Although the connector 10 in this embodiment is a male connector for a plug, in other embodiments it may be a female connector, or it may have a different connection arrangement other than a plug. Each of the ventilation pathways 34 includes a first end 50 disposed in the first side 38 of the connector housing 14 and a second end 52 disposed in the second side 42 of the connector housing 14; this is illustrated in FIG. 4A, although not all of the first and second ends 50, 52 are illustrated for clarity.

The ventilation pathways 34 are apertures having a very small diameter—e.g., less than 0.5 millimeters (mm). This helps to ensure that liquid will not enter the electrical enclosure 12 even while air or other gases are allowed to freely move in and out. In at least some embodiments, a hydrophobic or oleophobic coating—e.g., a fluoropolymer—can be applied to the second ends 52 of the ventilation pathways 34 to further inhibit liquids from entering the enclosure 12. To further assist in keeping liquids from entering the electrical enclosure 12, the electrical connector 10 includes a blocking member 54 disposed on the second side 42 of the connector housing 14. In addition to inhibiting liquid ingress, the blocking member 54 also protects the ventilation pathways 34 by keeping them from incurring a direct impact with an external object or a liquid stream. In this embodiment, the blocking member 54 is formed from the first portion 16 of the connector housing 14, which extends over the second ends 52 of the ventilation pathways 34.

In FIG. 4A, the ventilation pathways 34 are very close together. This combined with the thin wall in this area makes the protection provided by the blocking member 54 even more important. In the embodiment shown in FIG. 4B, a cross section of an electrical connector 15 is illustrated. Similar to electrical connector 10, the electrical connector 15 includes a connector housing 17 having a housing body 19 forming a first portion of the connector housing 17, and a second portion 21 configured as an attachment arrangement. The housing body 19 includes a plurality of connector apertures 23 each configured to receive an electrical conductor 25.

Figure 4B:
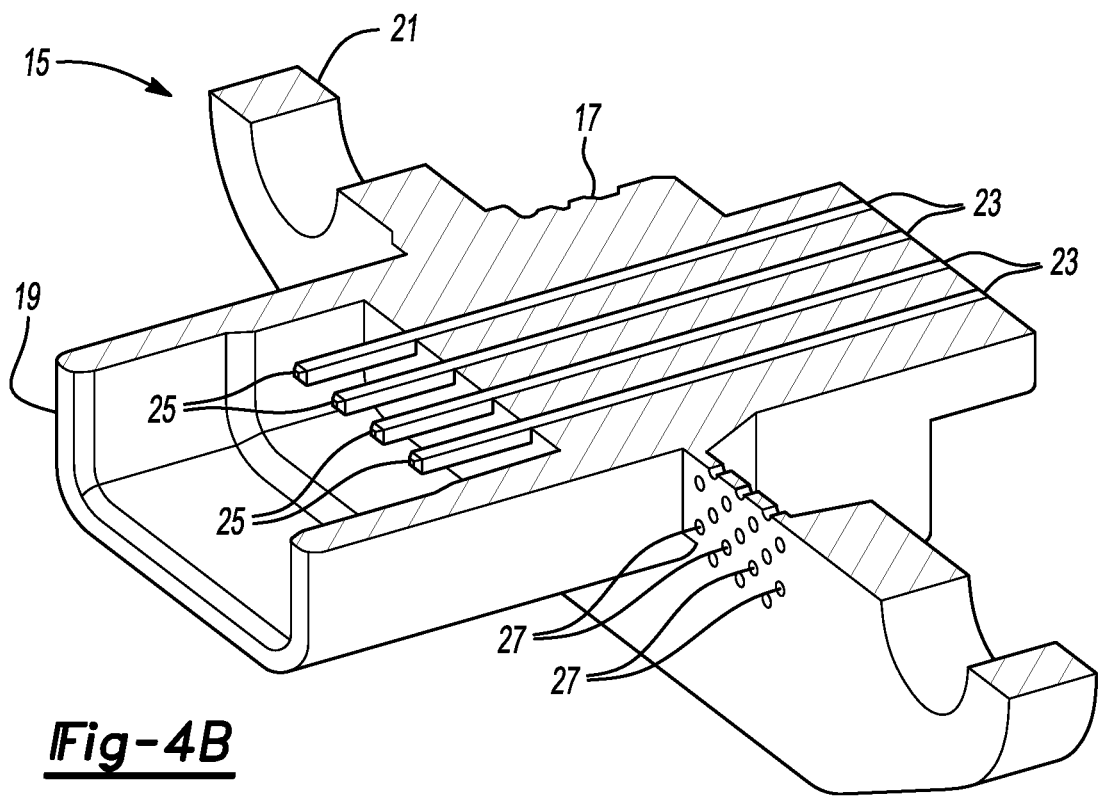
FIG. 4B shows an electrical connector in accordance with embodiments described herein.

One difference in the configuration of the connector housing 17 as compared to the connector housing 14 shown in FIG. 4A is the arrangement of the ventilation pathways 27—not all of which are labeled in FIG. 4B for clarity. The ventilation pathways 27 have diameters that are similar to or the same as the ventilation pathways 34 in the connector housing 14; however, as illustrated in FIG. 4B, the ventilation pathways 27 are spaced much farther apart than the ventilation pathways 34. As a result, there is more material in this area and the connector housing 17 in this area is correspondingly stronger. Therefore, the connector housing 17 is not configured with a blocking member, such as the blocking member 54 shown in FIG. 4A.

Figure 5:
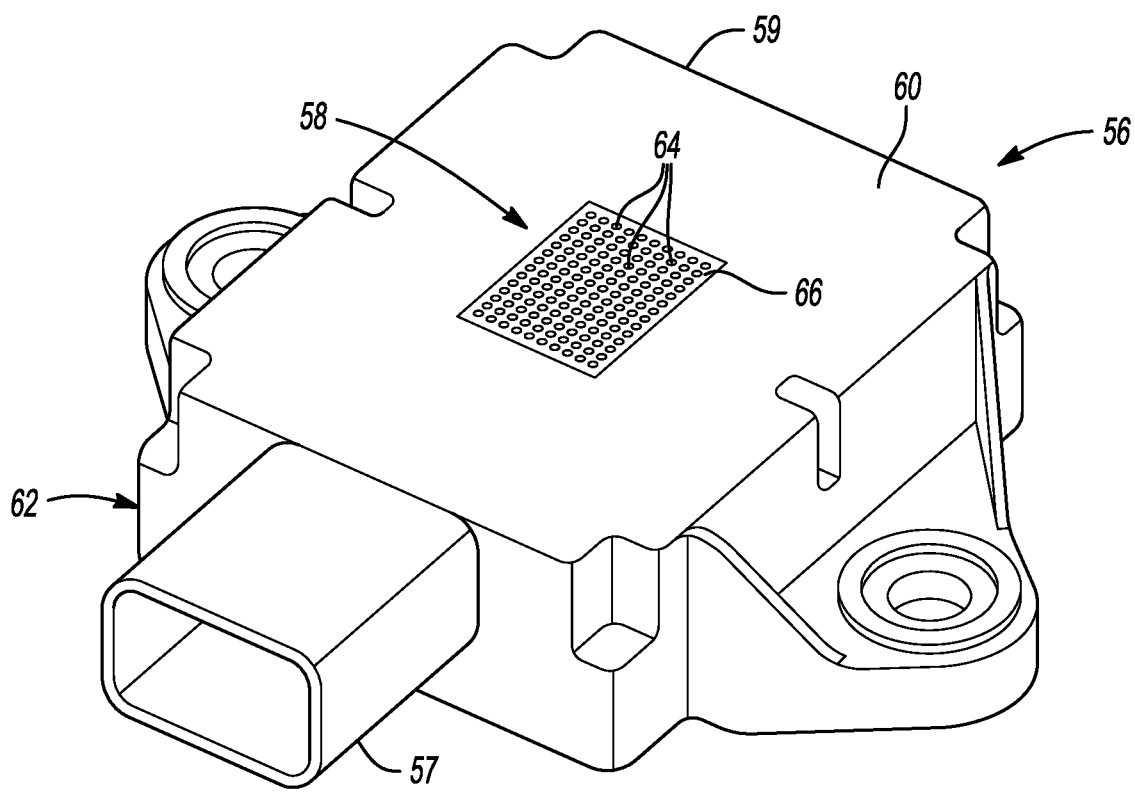
FIG. 5 shows an electrical connector in accordance with embodiments described herein including a plurality of ventilation apertures.

FIG. 5 shows an electrical connector 56 including a connector housing 62 in accordance with embodiments described herein. In this embodiment, the connector housing 62 includes a portion 57 configured as a housing body integrally molded with a portion 59 configured as an electrical enclosure 59. Thus, the connector housing 62 is a unitary structure comprising the housing body 57 and the enclosure 59. In this embodiment, the connector housing 62 is configured for attachment to an electrical enclosure by being configured for a molding process including the housing body 57 and the enclosure 59 to form a unitary structure.

As shown in FIG. 5, a ventilation arrangement 58 is disposed in a top 60 of the enclosure portion 59 of the connector housing 62. This embodiment also includes a plurality of ventilation pathways 64 configured as a series of very small holes, for example, having diameters less than 0.5 mm. Because the connector housing 62 does not include a blocking member to further inhibit ingress of liquids, the connector 56 includes a coating 66 disposed over the ends of the ventilation pathways 64. As described above, the coating 66 may be hydrophobic or oleophobic, or some other coating that repels liquids. In other embodiments, a coating, such as the coating 66 may not be used. In some embodiments, small holes could be disposed directly in an electrical enclosure, such as the enclosure 12; these holes could be in addition to or instead of the holes forming the ventilation pathways 34 in the connector housing 62.

Figure 6:
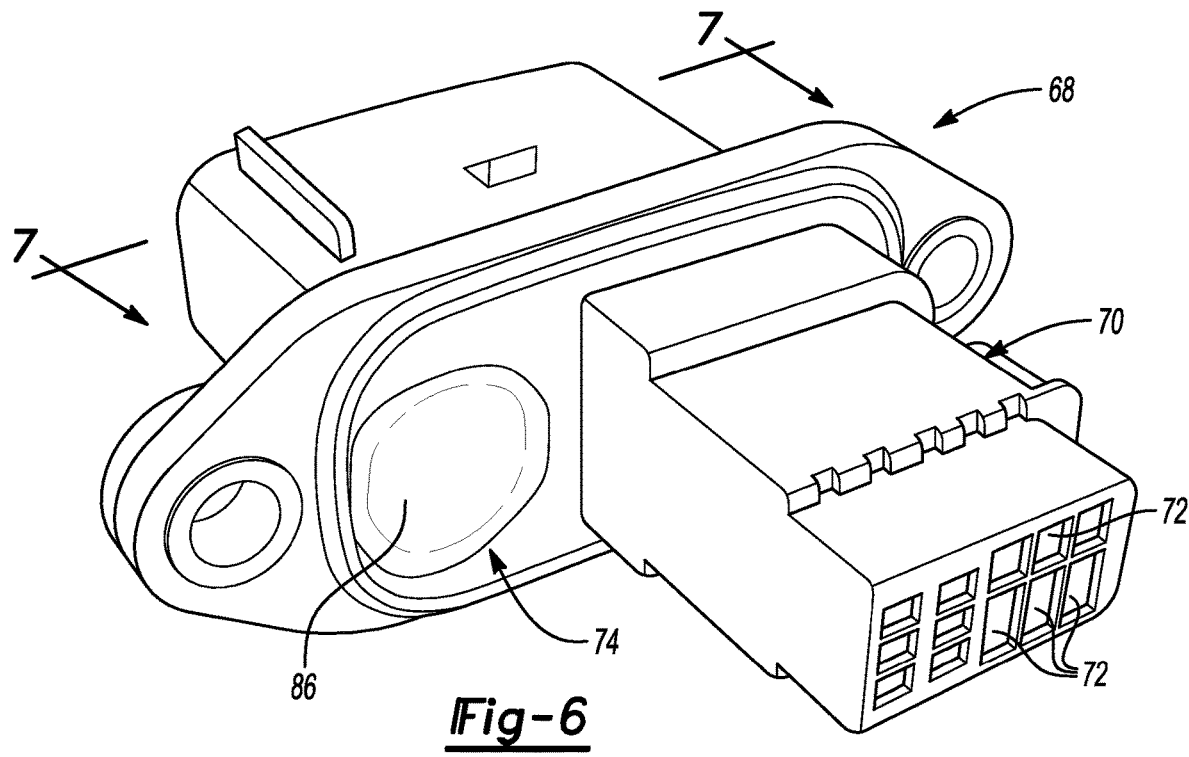
FIG. 6 shows an electrical connector in accordance with embodiments described herein including a ventilation pathway and cover.
Figure 7:
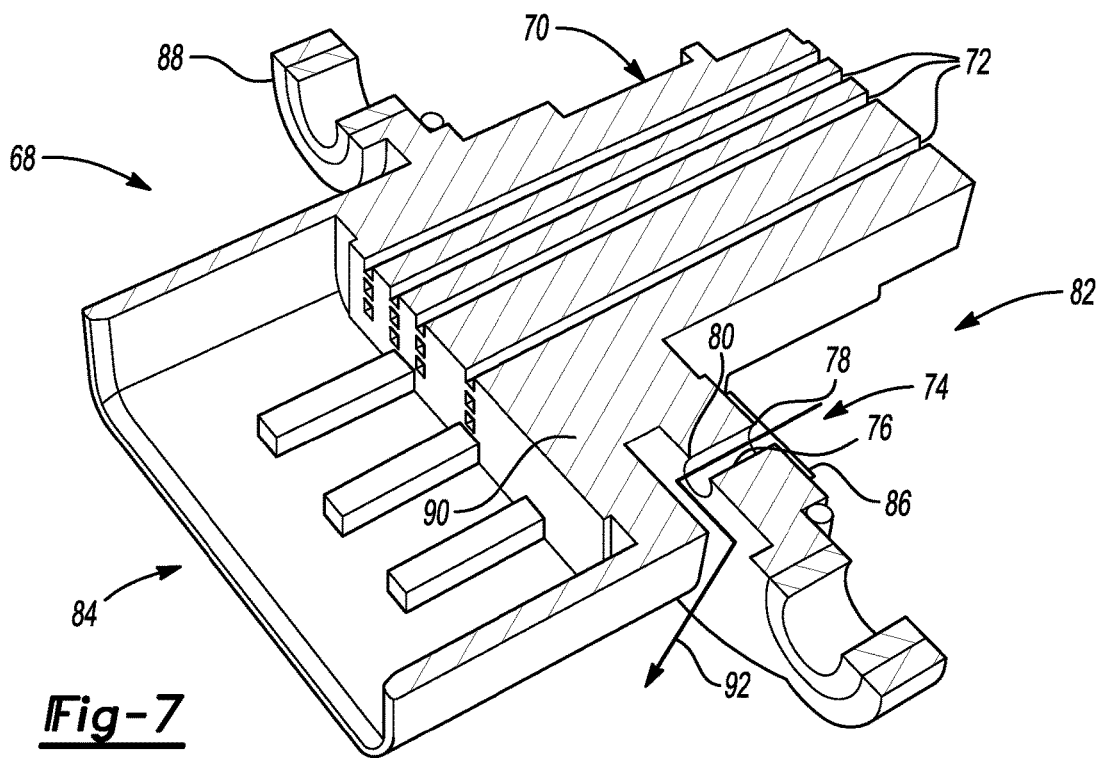
FIG. 7 shows a cross-sectional view of the electrical connector shown in FIG. 6.

In some embodiments, an electrical connector may include a blocking member that is separate from the connector housing: this is illustrated in FIGS. 6 and 7. FIG. 6 shows an electrical connector 68 that includes a connector housing 70 having a plurality of connector apertures 72—not all of which are labeled in FIG. 6 for clarity—configured to receive therein an electrical conductor, such as a copper or aluminum pin. Separate from the connector apertures 72 is a ventilation arrangement 74, which forms a fluid communication path between an inside of an electrical enclosure and an outside of an electrical enclosure when the connector 68 is attached to the electrical enclosure—see, e.g., the electrical connector 10 attached to the electrical enclosure 12 in FIGS. 1 and 2.

FIG. 7 is a cross-sectional view of the electrical connector 68 taken through line 7-7 shown in FIG. 6. As shown in FIG. 7, the ventilation arrangement 74 includes a ventilation pathway 76 having a first end 78 and a second end 80 disposed between a first side 82 and a second side 84 of the connector housing 70. Unlike the embodiments illustrated in FIGS. 1-5, the ventilation arrangement 74 includes a single ventilation pathway 76 formed in the connector housing 70. In at least some embodiments, the ventilation pathway 76 may be an aperture having a diameter much larger than the holes 34 described above. Because of this, the electrical connector 68 includes a blocking member 86 that is separate from the connector housing 70. As shown in FIG. 6, the blocking member 86 is a cover that includes a semi-permeable membrane, which is configured to allow transfer of gas while inhibiting liquid from passing through it. The blocking member 86 may be made from, for example, an expanded polytetrafluoroethylene material, which provides a plurality of ventilation pathways through it and may be attached to the connector housing 70 by ultrasonic welding, adhesive, or any other attachment mechanism effective to maintain the blocking member 86 in its desired position.

Similar to the connector housing 14, the connector housing 70 includes a first portion 86 having the connector apertures 72 disposed therein. Just like the connector apertures 20 shown in FIG. 4A, the apertures 72 will have conductor elements, such as pins, inserted into them. The connector housing 70 also includes a second portion 88 configured for attachment to an electrical enclosure. In addition to the blocking member 86, the electrical connector 82 includes a second blocking member 90, which is formed from a part of the second portion 88 of the connector housing 70. As illustrated by the direction arrow 92, the ventilation pathway 76 is straight through the second portion 88 of the connector housing 70, but because of the blocking member 90, air or other gases must travel a non-straight or meandering path to get through the ventilation pathway 76. This configuration also helps to inhibit the ingress of water or other liquids and protects the blocking member 86 from direct impact with external objects or high-pressure fluid streams, either of which could damage the blocking member 86 or compromise its fixation to the connector housing 70.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electrical connector, comprising:
a connector housing configured for attachment to an electrical enclosure, the connector housing including a plurality of connector apertures each configured to receive an electrical conductor therein and having a first end open to an inside of the electrical enclosure and a second end open to an outside of the electrical enclosure when the connector housing is attached to the electrical enclosure, the connector housing further including a ventilation arrangement having a ventilation pathway separate from the connector apertures and forming a fluid communication path between the inside of the electrical enclosure and the outside of the electrical enclosure when the connector housing is attached to the electrical enclosure; and wherein the connector housing further includes a first portion having the connector apertures disposed therein and a second portion configured for attachment to the electrical enclosure, the second portion including a first face and a second face having the ventilation pathway extending therebetween, and wherein the first portion of the connector housing extends over an opening of the ventilation pathway disposed in one of the first face or the second face.

2. The electrical connector of claim 1, wherein the ventilation arrangement includes a plurality of the ventilation pathways, each of the ventilation pathways having a diameter less than 0.5 mm.

3. The electrical connector of claim 1, further comprising a cover disposed over an opening of the ventilation pathway disposed in the other one of the first face or the second face.

4. The electrical connector of claim 1, wherein the ventilation pathway includes a first end open to the inside of the electrical enclosure and a second end open to the outside of the electrical enclosure when the connector housing is attached to the electrical enclosure, the electrical connector further comprising a blocking member disposed over the first end or the second end of the ventilation pathway.

5. The electrical connector of claim 4, wherein the blocking member comprises a material that allows gas to pass through the blocking member and inhibits liquid from passing through the blocking member.

6. The electrical connector of claim 4, wherein the blocking member comprises the first portion of the connector housing.

7. An electrical connector, comprising:
a connector housing configured for attachment to an electrical enclosure such that a first side of the connector housing faces an inside of the electrical enclosure and a second side of the connector housing faces an outside of the electrical enclosure, the connector housing including a connector aperture configured to receive an electrical conductor therein and extending between the first and second sides of the connector housing, the connector housing further including a ventilation pathway separate from the connector aperture and defining a fluid communication path between the first side and the second side of the connector housing;
wherein the connector housing further includes a first portion and a second portion forming a unitary structure, and one of the first portion or the second portion extends over an opening of the ventilation pathway.

8. The electrical connector of claim 7, wherein the connector housing includes a plurality of the ventilation pathways, each of the ventilation pathways having a diameter less than 0.5 mm.

9. The electrical connector of claim 7, wherein the ventilation pathway includes a first end disposed in the first side of the connector housing and a second end disposed in the second side of the connector housing, and wherein a portion of the connector housing is disposed over the second end of the ventilation pathway.

10. The electrical connector of claim 7, further comprising a blocking member disposed on the first side or the second side of the connector housing and positioned over an opening of the ventilation pathway.

11. The electrical connector of claim 10, wherein the blocking member comprises a material that allows gas to pass through the blocking member and inhibits liquid from passing through the blocking member.

12. The electrical connector of claim 7, wherein the first portion of the connector housing has the connector aperture disposed therein and the portion of the connector housing is configured for attachment to the electrical enclosure, and wherein the first portion of the connector housing extends over an opening of the ventilation pathway disposed in one of the first side or the second side of the connector housing.

13. The electrical connector of claim 12, further comprising a cover disposed over an opening of the ventilation pathway disposed in the other one of the first side or the second side of the connector housing.

14. An electrical connector, comprising:
a connector housing including a housing body configured to receive at least one electrical conductor therein and configured for attachment to an electrical enclosure, the connector housing including a ventilation arrangement having a ventilation pathway defining a fluid communication path between the inside of the electrical enclosure and the outside of the electrical enclosure when the housing body is attached to the electrical enclosure, the housing body including a first portion integrally formed with a second portion, and one of the first portion or the second portion is positioned over one opening in the ventilation pathway.

15. The electrical connector of claim 14, further comprising a cover disposed over one other opening of the ventilation pathway.

16. The electrical connector of claim 14, further comprising a semi-permeable membrane positioned over an opening of the ventilation pathway.

17. The electrical connector of claim 14, wherein the ventilation arrangement includes a plurality of the ventilation pathways disposed in at least one of the housing body or the electrical enclosure.

18. The electrical connector of claim 17, further comprising a hydrophobic coating disposed over one end of the ventilation pathways.

* * * * *